(12) United States Patent
Hwang et al.

(10) Patent No.: US 7,211,335 B2
(45) Date of Patent: May 1, 2007

(54) RED ORGANIC LIGHT-EMITTING COMPOUND AND ORGANIC LIGHT-EMITTING DEVICE COMPRISING THE SAME

(75) Inventors: Ha-Geun Hwang, Sungnam-si (KR); Ki-Seok Kim, Suwon-si (KR)

(73) Assignee: Neoviewkolon Co., Ltd., Hongseong-Gun (KR)

( * ) Notice: Subject to any disclaimer, the term of this patent is extended or adjusted under 35 U.S.C. 154(b) by 118 days.

(21) Appl. No.: 10/507,905

(22) PCT Filed: Mar. 19, 2003

(86) PCT No.: PCT/KR03/00536

§ 371 (c)(1),
(2), (4) Date: Sep. 16, 2004

(87) PCT Pub. No.: WO03/078542

PCT Pub. Date: Sep. 25, 2003

(65) Prior Publication Data

US 2006/0022584 A1    Feb. 2, 2006

(30) Foreign Application Priority Data

Mar. 19, 2002 (KR) .................. 10-2002-0014757
Jan. 29, 2003 (KR) .................. 10-2003-0005827

(51) Int. Cl.
*H01L 29/08* (2006.01)
*H01J 63/04* (2006.01)
*C07D 495/02* (2006.01)
*C07D 409/14* (2006.01)

(52) U.S. Cl. .................. 428/690; 428/917; 549/60; 549/50; 548/364.4; 257/40

(58) Field of Classification Search ............ 313/504; 549/60, 50; 548/364.4; 257/40; 428/690, 428/917

See application file for complete search history.

(56) References Cited

U.S. PATENT DOCUMENTS 5,908,581 A   6/1999   Chen et al.
5,935,720 A   8/1999   Chen et al.

FOREIGN PATENT DOCUMENTS

JP    08-100173 A        4/1996
JP    11-067454 A        3/1999
JP    2002220586 A   *   8/2002
KR    10-0252976 B1      11/1999

OTHER PUBLICATIONS

ACS Symposium Series (1997), 672 (Photonic and Optoelectronic Polymers), p. 169-182.*
Journal of Applied Spectroscopy, vol. 69, No. 2, 2002.*
Journal of Molecular Structure (Theochem), 545, 2001, p. 61-65.*

* cited by examiner

*Primary Examiner*—Dawn L. Garrett
(74) *Attorney, Agent, or Firm*—Birch, Stewart, Kolasch & Birch, LLP

(57) ABSTRACT

A red organic light-emitting compound which has a superior heat-resistance and is capable of adjusting the color of the emitted light, and an organic light-emitting device including the same are disclosed. The organic light-emitting compound has the structure of the following chemical formula, and the organic light-emitting device includes the first electrode having a high work function; the second electrode having a low work function; and at least one organic layer formed between the first electrode and the second electrode, which includes the red organic light-emitting compound, wherein, X is C, O, S, $SO_2$ or N; Y is S or —$CR_{11}$=$CR_{12}$—; $R_1$, $R_2$, $R_3$, $R_{11}$ and $R_{12}$ can be the same or different, and are hydrogen, alkyl group of 1 to 20 carbon atoms, alkoxy group of 1 to 5 carbon atoms, aryl or heteroaryl group of 4 to 24 carbon atoms, heterocyclic group of 4 to 6 carbon atoms, or fused ring group of 4 to 24 carbon atoms; $R_4$ and $R_5$ can be the same or different, and are the functional group defined for $R_1$ or O; when $R_4$ and $R_5$ are O. $R_4$ and $R_5$ can be connected to form a heterociclyc ring; is the functional group defined for $R_1$ or amine group; and n is 1, 2 or 3.

13 Claims, 1 Drawing Sheet

RED ORGANIC LIGHT-EMITTING COMPOUND AND ORGANIC LIGHT-EMITTING DEVICE COMPRISING THE SAME

FIELD OF THE INVENTION

The present invention relates to an organic light-emitting compound, and more particularly, to a red organic light-emitting compound which has a superior heat-resistance and is capable of adjusting the color of the emitted light, and an organic light-emitting device including the same.

BACKGROUNDS OF THE INVENTION

An organic light-emitting device, which is generally called as EL (Electroluminescence device), is one of the representative flat-panel display devices along with Liquid Crystal Display (LCD), Plasma Display Panel (PDP), and Field Emission Display (FED). The organic light-emitting device does not require a back-light for light-emitting, and can be manufactured into a thin film and flexible type device, and mass-produced by the well-known film fabrication techniques. In addition, the EL is a self-light emitting device. Therefore, the EL has not only a fast response speed but also an excellent brightness and wide viewing angle. Also, the EL can be operated with a low driving voltage, and display full colors in a visible region.

In the organic light-emitting device, an organic light-emitting layer having a light-emitting property is interposed between a transparent electrode made of ITO having a high work function and a metal electrode made of Mg having a low work function. When a voltage is applied to the electrodes, holes and electrons are generated at the electrodes, and recombined at the organic light-emitting layer to induce a light-emission. To produce a full-color organic light-emitting device, it is necessary to prepare organic light-emitting compounds for emitting red (R), green (G) or blue (B) light. Such organic light-emitting compounds are disclosed in various references, for example, U.S. Pat. Nos. 3,852,683, 3,986,140, 4,012,376, 4,146,707, 4,769,292, 5,018,160, 5,294,869, 5,409,783, 5,492,942, 5,908,581, and 5,935,720, "Design and Synthesis of Red Dopants for Electroluminescence" (C. H. Chen and C. W. Tang, Chemistry of Functional Dyes, Vol. 2, pp. 536–543 (1993)), "Electroluminescence of Doped Organic Thin Films" (C. W. Tang, S. A. VanSlyke, and C. H. Chen, Journal of Applied Physics, Vol. 65, pp. 3610–3616 (1989)), "Red-light-emitting organic electroluminescent devices with bisanil dye as emitter" (Junsheng YU, Zhijian CHEN, and Seizo MIYATA, Jpn. J. Appl. phys. Vol. 40(2001) pp. 3201–3205) et al.

Among the organic light-emitting compounds, 4-dicyanomethylene-2-methyl-6-(p-dimethylaminostyryl)-4H-pyran (DCM), which emits the light having the wavelength of 590 nm, and 4-dicyanomethylene-6-cp-julolidinostyryl-2-tert-butyl-4H-pyran (DCJTB), which emits the light having the wavelength of 630 nm and is one of the derivatives of DCM, are conventionally used as the red organic light-emitting compound. The red organic light-emitting compound having the DCM structure is produced by substituting a substituent, such as alkyl group, to nitrogen. Therefore, the compound having the DCM structure has a low heat resistance, which results in the decrease of the life span of the organic light-emitting device.

SUMMARY OF THE INVENTION

Therefore, it is an object of the present invention to provide a red organic light-emitting compound having a novel structure, and an organic light-emitting device including the same.

It is other object of the present invention to provide an organic light-emitting compound which has a superior heat-resistance and stability, and is capable of emitting red lights of various wavelength, and an organic light-emitting device including the same.

It is another object of the present invention to provide an organic light-emitting compound which can be used as a red host material or a red dopant in an organic light-emitting layer, and an organic light-emitting device including the same.

In order to achieve these objects, the present invention provides a red organic light-emitting compound of the following chemical formula. The present invention also provides an organic light-emitting device comprising: the first electrode having a high work function; the second electrode having a low work function; and at least one organic layer formed between the first electrode and the second electrode, which includes the red organic light-emitting compound of the following chemical formula,

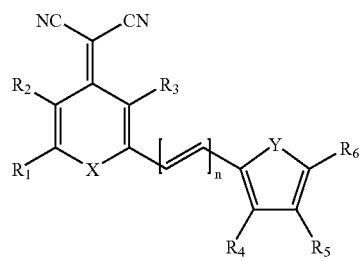

wherein, X is C, O, S, $SO_2$ or N; Y is S or

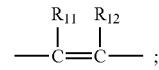

$R_1$, $R_2$, $R_3$, $R_{11}$ and $R_{12}$ can be the same or different, and are hydrogen, substituted or non-substituted alkyl group containing from 1 to 20 carbon atoms, substituted or non-substituted alkoxy group containing from 1 to 5 carbon atoms, substituted or non-substituted aryl or heteroaryl group containing from 4 to 24 carbon atoms, substituted or non-substituted heterocyclic group containing from 4 to 6 carbon atoms, or fused ring group containing from 4 to 24 carbon atoms; and $R_4$ and $R_5$ can be the same or different, and are the functional group defined for $R_1$ or O. When $R_4$ and $R_5$ are O, $R_4$ and $R_5$ can be connected to form a heterocyclic ring. $R_6$ is the functional group defined for $R_1$ or substituted or non-substituted amine group; and n is 1, 2 or 3.

DETAILED DESCRIPTION OF THE INVENTION

Figure 1:
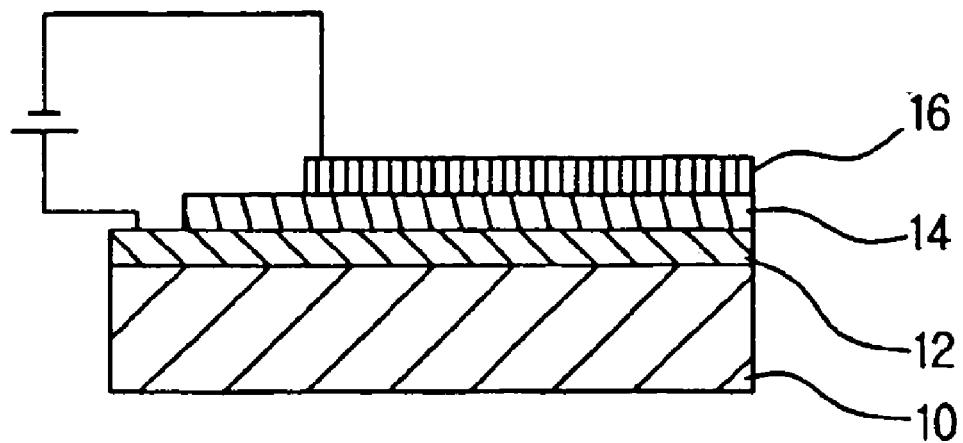
FIG. 1 is a cross sectional view of the organic light-emitting device according to an embodiment of the present invention.

A more complete appreciation of the invention, and many of the attendant advantages thereof, can be better appreciated by reference to the following detailed description and the accompanying drawings.

The red organic light-emitting compound of the present invention absorbs the energy generated by the recombination of electrons and holes, and emits red light using the absorbed energy. The compound of the present invention can be represented by the following chemical formula 1.

[Chemical formula 1]

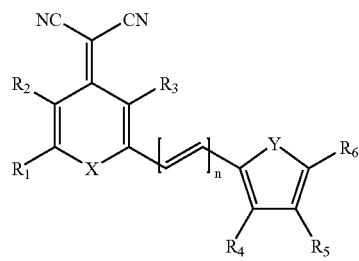

In chemical formula 1, X is C, O, S, $SO_2$ or N; Y is S or

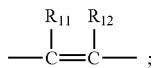

$R_1$, $R_2$, $R_3$, $R_{11}$ and $R_{12}$ can be the same or different, and are hydrogen, substituted or non-substituted alkyl group containing from 1 to 20 carbon atoms, substituted or non-substituted alkoxy group containing from 1 to 5 carbon atoms, substituted or non-substituted aryl or heteroaryl group containing from 4 to 24 carbon atoms, substituted or non-substituted heterocyclic group containing from 4 to 6 carbon atoms, or fused ring group containing from 4 to 24 carbon atoms; and $R_4$ and $R_5$ can be the same or different, and are the functional group defined for $R_1$ or O. When $R_4$ and $R_5$ are O, $R_4$ and $R_5$ can be connected to form a heterocyclic ring. $R_6$ is the functional group defined for $R_1$ or substituted or non-substituted amine group; and n is 1, 2 or 3. The exemplary substituent which can be substituted to $R_1$ to $R_6$, $R_{11}$ and $R_{12}$ includes lower alkyl group containing from 1 to 5 carbon atoms, aryl group such as phenyl, tolyl and so on, amine group, halogen and so on. When X is C or N, X can be substituted with the functional group defined for $R_1$. The fused ring group is the functional group produced by fusing ring compounds, and the non-limiting example of the fused ring group includes the functional group formed by fusing two or more benzene rings, such as

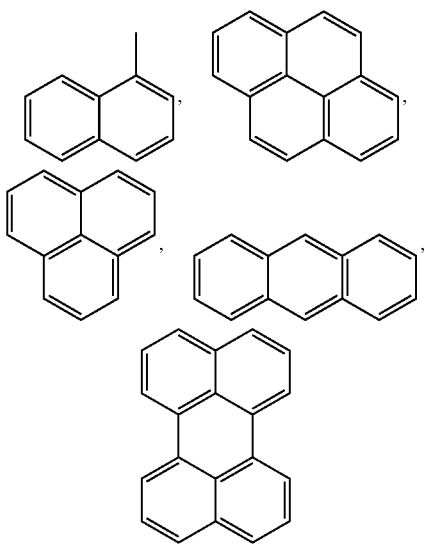

and soon.

The preferable example of the red organic light-emitting compound of the present invention includes the compounds represented by the following chemical formulas 2 to 6.

[Chemical formula 2]

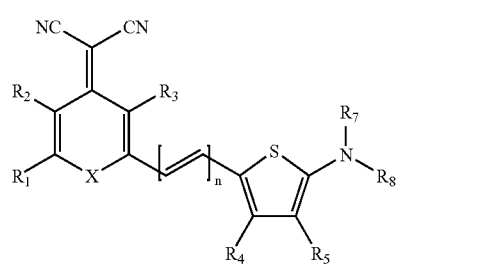

In chemical formula 2, X and $R_1$ to $R_5$ are as defined in chemical formula 1; $R_7$ and $R_8$ can be the same or different, and are the functional group defined for $R_1$ in chemical formula 1; and n is 1, 2 or 3.

[Chemical formula 3]

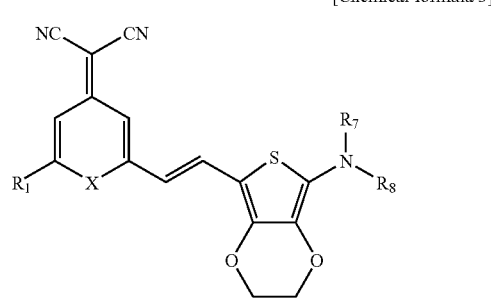

In chemical formula 3, X, $R_1$, $R_7$ and $R_8$ are as defined in chemical formula 2. More preferably, X is O; $R_1$ is tert-butyl group; and $R_7$ and $R_8$ are methyl group.

[Chemical formula 4]

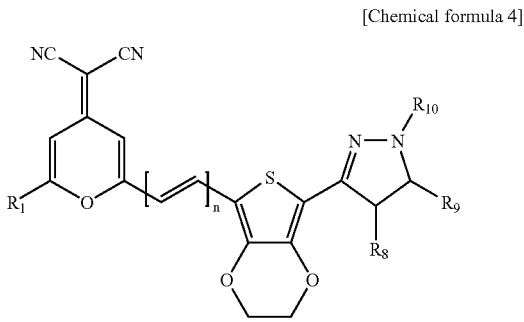

In chemical formula 4, $R_1$ and $R_8$ to $R_{10}$ are the functional group defined for $R_1$ in chemical formula 1; and n is 1, 2 or 3. More preferably, $R_1$ is tert-butyl group; $R_8$ is hydrogen; $R_9$ is phenyl group; and $R_{10}$ is 3-methylphenyl group.

[Chemical formula 5]

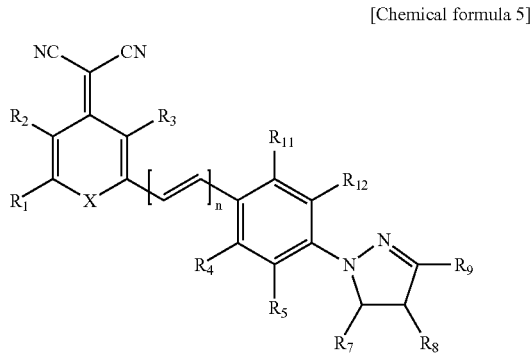

In chemical formula 5, X, $R_1$ to $R_5$, $R_{11}$ and $R_{12}$ are as defined in chemical formula 1; $R_7$ to $R_9$ can be the same or different, and are the functional group defined for $R_1$ in chemical formula 1; and n is 1, 2 or 3. More preferably, at least one of $R_1$ to $R_5$, $R_7$ to $R_9$, $R_{11}$ and $R_{12}$ is isopropyl or t-butyl group, and $R_1$ to $R_5$, $R^7$ to $R_9$, $R_{11}$ and $R_{12}$ can be connected to form a conjugated and fused ring with the benzene ring or the pyrazoline ring in the compound of chemical formula 5.

[Chemical formula 6]

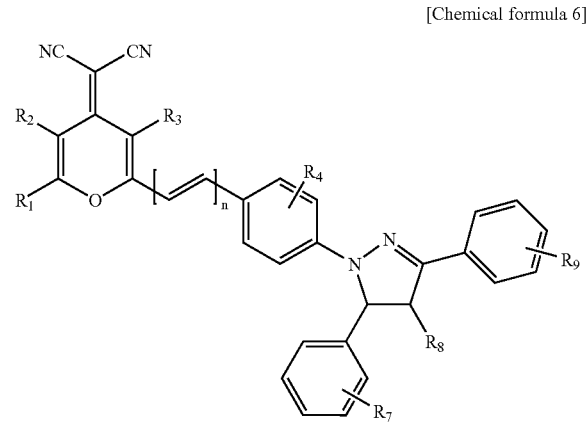

In chemical formula 6, $R_1$ to $R_4$ are as defined in chemical formula 1; $R_7$ to $R_9$ can be the same or different, and are the functional group defined for $R_1$ in chemical formula 1; and n is 1, 2 or 3.

The red organic light-emitting compound of the present invention emits various colors from orange to red according to the substituent of thiophene group, 3,4-ethylenedioxythiophene (EDOT) group, or pyrazoline group. Therefore, the compound can be used as a red host material or a red dopant in an organic light-emitting device. The organic light-emitting compound of the present invention can be prepared by various conventional methods. For example, the compound can be prepared by reacting substituted or non-substituted 2-(6-methyl-pyran-4-ylidene)-malononitrile and substituted or non-substituted thiophenyl carbaldehyde or 4-(4,5-dihydro-pyrazole-1-yl)-benzaldehyde in an alcoholic solvent and in the presence of a base, such as piperidine. The solid product obtained form the above reaction is separated by filtration, recrystallization or column chromatography to provide the pure target compound.

FIG. 1 is a cross sectional view of the organic light-emitting device including the organic light-emitting compound according to an embodiment of the present invention. As shown in FIG. 1, the first electrode 12 (anode) having a high work function is formed on a substrate 10, and at least one light-emitting layer 14 including the organic light-emitting compound of the present invention is formed on the first electrode 12. The light-emitting layer 14 may further include a conventional organic light-emitting compound, a fluorescent dye, a host and/or dopant material in addition to the organic light-emitting compound of the present invention. When the compound of the present invention is used as a dopant with the conventional host material, such as $Alq_3$, the preferable amount of the dopant is 2 to 50% by weight. On the light-emitting layer 14, the second electrode 16 (cathode) having a low work function is formed so that the second electrode 16 faces toward the first electrode 12. When a voltage is applied between the first electrode 12 and the second electrode 16 of the organic light-emitting device, the holes and the electrons produced in the first and the second electrodes 12, 16 are injected into the light-emitting layer 14. The injected holes and the electrons are recombined in the layer 14 to induce the light emission. The emitted light produces a display image by passing through the transparent first electrode 12 and the transparent substrate 10.

The substrate 10 of the organic light-emitting device is made of an electrically insulating material. If the organic light-emitting device is designed to emit light at the side of the first electrode 12, the substrate 10 should be made of a transparent material, preferably a glass or a transparent plastic film. The first electrode 12 can be made of the material having a high work function, for example, Indium Tin Oxide (ITO), polyaniline or Ag. The second electrode 16 can be made of the material having a low work function, for example, a metal such as Al, Mg or Ca, or a metal alloy such as Li—Al or Mg—Ag.

Figure 2:
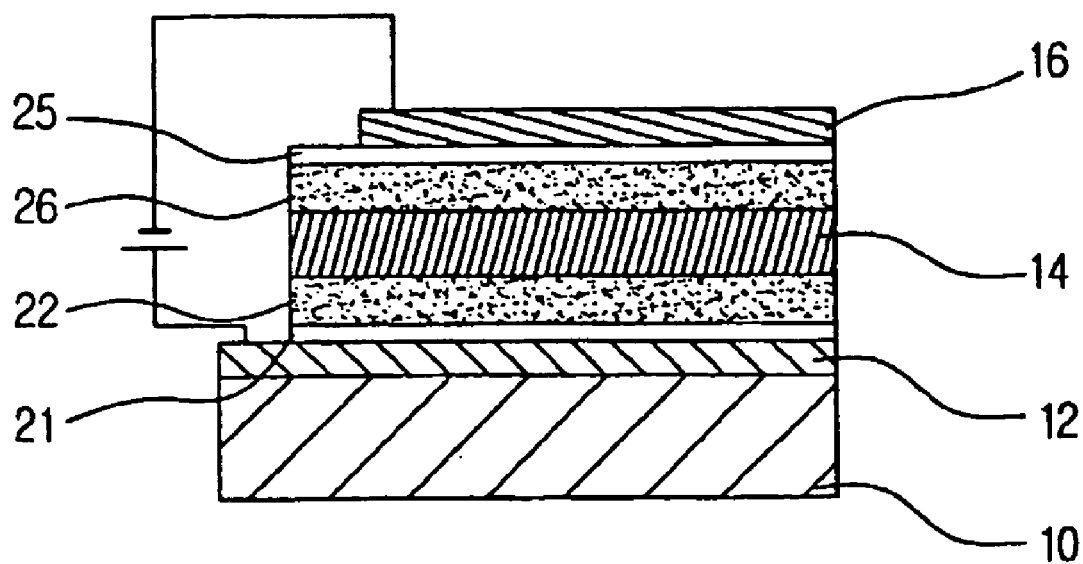
FIG. 2 is a cross sectional view of the organic light-emitting device according to other embodiment of the present invention.

FIG. 2 is a cross sectional view of the organic light-emitting device according to other embodiment of the present invention. In contrast to the organic light-emitting device shown in FIG. 1, the organic light-emitting device shown in FIG. 2 further includes a hole injecting layer 21 and a hole transporting layer 22 formed between the first electrode 12 and the light-emitting layer 14 to facilitate the injection and transportation of holes from the first electrode 12 into the light-emitting layer 14, and an electron injecting layer 25 and an electron transporting layer 26 formed between the second electrode 16 and the light-emitting layer 14 to facilitate the injection and transportation of electrons from the second electrode 16 into the light-emitting layer 14. The hole injecting layer 21 and the hole transporting layer 22 are provided to facilitate the stable hole injection and transportation, and to prevent the electron flow therethrough. Exemplary material for forming the hole injecting and the hole transporting layers 21, 22 includes porphyrinic compound, such as copper phthalocyanine (CuPc), disclosed in U.S. Pat. No. 4,356,429; tri(phenyldiamine) derivatives such as N,N'-diphenyl-N,N'-bis(3-methylphenyl)-[1,1'-biphenyl]-4,4'-diamine (TPD); amine derivatives having aromatic condensed ring such as 4,4',4''-tris[3-methylphenyl(phenyl)amino]triphenylamine (m-MTDATA), N,N'-diphenyl-N,N'-bis(1-naphthylphenyl)-1,1'-biphenyl-4,4'-diamine (α-NPD), N,N,N'N'-tetrakis(m-methylphenyl)-1,3-diaminobenzene (PDA), 1,1-bis[N,N-di(p-tolyl)aminophenyl]cyclohexane (TPAC), styrylamine derivatives, N,N'-bis-(1-naphthyl)-N,N'-diphenylbenzidine and so on. The electron injecting layer 25 and the electron transporting layer 26 are provided to facilitate the stable electron injection and transportation, and to prevent the hole flow therethrough. Exemplary material for forming the electron injecting and the electron transporting layers 25, 26 includes LiF, 1,2,4-triazole (TAZ), quinolin derivatives, tris(8-quinolinolate)aluminum (Alq3) and so on.

These layers improve the light-emitting efficiency by increasing the amounts of the holes and the electrons injected into the organic light-emitting layer 14, by constraining the holes and the electrons in the light-emitting layer 14, and by accelerating the hole-electron recombination. The thickness of the light-emitting layer 14, the hole injecting layer 21, the hole transporting layer 22, the electron injecting layer 25 or the electron transporting layer 26 can be varied, for example, according to the method for forming the layers, but the thickness is generally 5–1000 nm, preferably 10–500 nm.

The organic light-emitting compound of the present invention can be included into the hole injecting layer 21, the hole transporting layer 22, the electron injecting layer 25 and/or the electron transporting layer 26. The organic layers can be formed by conventional film fabrication processes such as spin coating, thermal evaporation, spin casting, sputtering, e-beam evaporation, chemical vapor deposition (CVD) and so on. The organic layers can be formed with the mixture of at least two compounds by the above-mentioned methods, or by co-depositing two or more compounds. The anode can also be formed by conventional processes, such as sputtering, ion plating, thermal depositing by using e-gun and so on. The metal layer for forming the cathode can be produced by thermal evaporation, sputtering, chemical vapor deposition, ion plating, and so on. The organic light-emitting compound of the present invention can be used for producing not only the organic light-emitting devices shown in FIG. 1 or FIG. 2 but also for producing various organic light-emitting device utilizing the electron-hole recombination for light emission.

Hereinafter, the preferable examples of the present invention are provided for better understanding of the present invention. However, the following examples are to illustrate the present invention, and the present invention cannot be limited by the following examples.

EXAMPLE 1

Synthesis of 2-{2-tert-butyl-6-[2-(7-dimethylamino-2,3-dihydro-thieno[3,4-b][1,4]dioxine-5-yl)-vinyl]-pyran-4-ylidene}-malononitrile As shown in the following reaction 1, 2.14 g (10 mmol) of 2-(2-tert-butyl-6-methyl-pyran-4-ylidene)-malononitrile and 2.13 g (10 mmol) of 7-dimethylamino-2,3-dihydro-thieno[3,4-b][1,4]dioxine-5-carbaldehyde were added into 100 ml of ethanol, and 0.93 g (11 mmol) of piperidine was added thereto. The reaction solution was heated at 75° C. for 10 hours. After cooling the reaction solution, the precipitated red solid was filtered, and recrystallized with ethanol to obtain 2 g of the target compound (Yield 48%).

[Reaction 1]

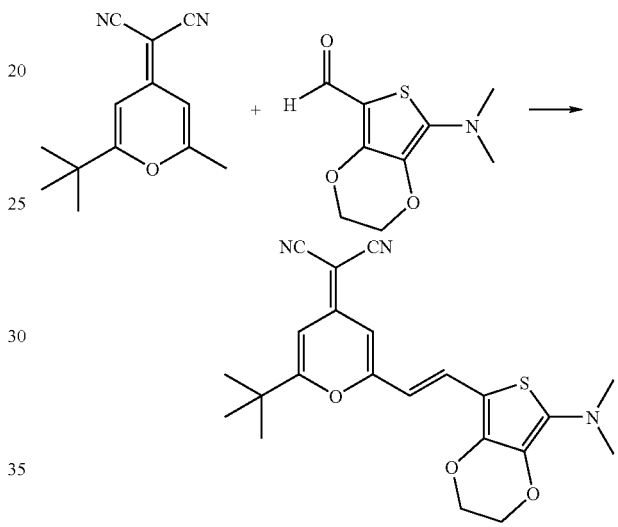

EXAMPLE 2

Synthesis of 2-(2-tert-buty-6-{2-[7-(5-phenyl-1-m-tolyl-4,5-dihydro-1H-pyrazol-3-yl)-2,3-dihydro-thieno[3,4-b][1,4]dioxy-5-yl]-vinyl}-pyran-4-ylidene)-malononitrile As shown in the following reaction 2, 0.21 g (1 mmol) of 2-(2-tert-butyl-6-methyl-pyran-4-ylidene)-malononitrile and 0.4 g (1 mmol) of 7-(5-phenyl-1-m-tolyl-4,5-dihydro-1H-pyrazol-3-yl)-2,3-dihydro-thieno[3,4-b][1,4]dioxine-5-carbaldehyde were added into 30 ml of ethanol, and 93 mg (1.1 mmol) of piperidine was added thereto. The reaction solution was heated at 75° C. for 10 hours. After cooling the reaction solution, the precipitated red solid was filtered, and recrystallized with ethanol to obtain 0.42 g of the target compound (Yield 70%).

[Reaction 2]

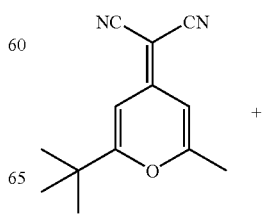

-continued

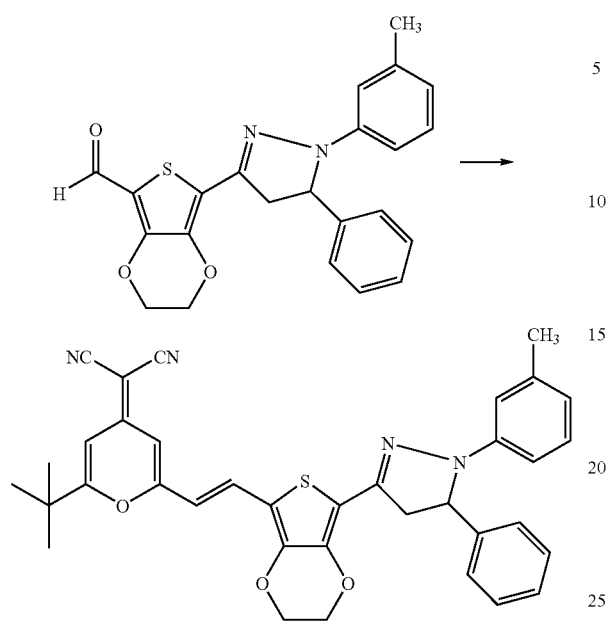

EXAMPLE 3

Synthesis of 2-(2-tert-butyl-6-{2-[5-(4-diphenylamino-phenyl)-thiophene-2-yl]-vinyl}-pyran-4-ylidene)-malononitrile As shown in the following reaction 3, 0.72 g (3.37 mmol) of (2-(2-tert-butyl-6-methyl-pyran-4-ylidene)-malononitrile and 1 g (2.81 mmol) of 5-(4-diphenylamino-phenyl)-thiophene-2-carbaldehyde were added into 50 ml of ethanol, and 0.28 g (3.37 mmol) of piperidine was added thereto. The reaction solution was heated for 24 hours while refluxing. After cooling the reaction solution, the precipitated red solid was filtered, and recrystallized with ethanol to obtain 0.79 g of the target compound (Yield 50%).

[Reaction 3]

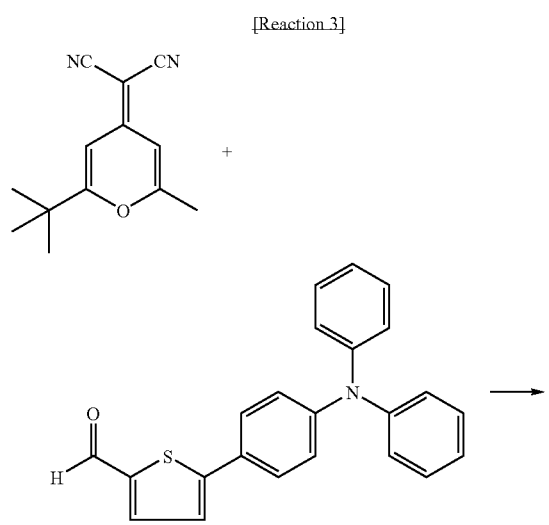

-continued

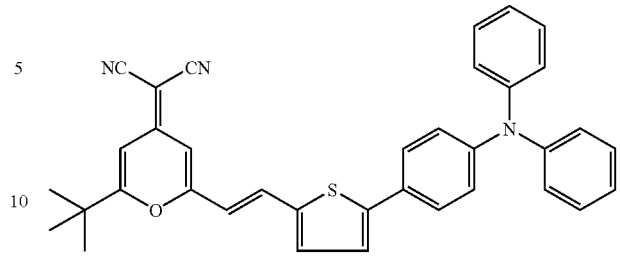

EXAMPLE 4

Synthesis of 2-(2-{2-[4-(3,5-diphenyl-4,5-dihydro-pyrazol-1-yl)-phenyl]-vinyl}-6-phenyl-pyran-4-ylidene)-malononitrile As shown in the following reaction 4, 0.4 g (1.7 mmol) of 2-(2-methyl-6phenyl-pyran-4-ylidene)-malononitrile and 0.55 g (1.7 mmol) of 4-(3,5-diphenyl-4,5-dihydro-pyrazol-1-yl)-benzaldehyde} were added into 40 ml of ethanol, and 0.17 g (2.0 mmol) of piperidine was added thereto. The reaction solution was heated at 75° C. for 10 hours.

[Reaction 4]

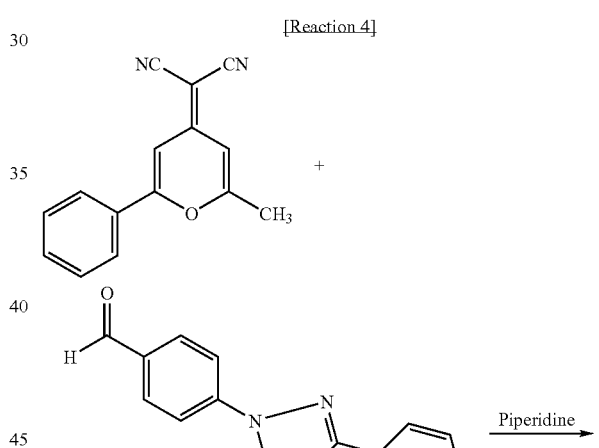

After cooling the reaction solution, the precipitated red solid was filtered, and recrystallized with ethanol to obtain 0.8 g of the target compound (Yield 86%).

EXAMPLE 5

Synthesis of 2-[2-(2-{4-[3-(2-methoxy-phenyl)-5-phenyl-4,5-dihydro-pyrazol-1-yl]-phenyl}-vinyl)-6-phenyl-pyran-4-ylidene]-malononitrile As shown in the following reaction 5, 0.197 g (0.84 mmol) of 2-(2-methyl-6-phenyl-pyran-4-ylidene)-malononitrile and 0.30 g (0.84 mmol) of 4-[3-(2-methoxy-phenyl)-5-phenyl-4,5-dihydro-pyrazol-1-yl]-benzaldehyde were added into 20 ml of alcohol (ethanol), and 0.10 g (1.2 mmol) of piperidine was added thereto. The reaction solution was heated at 75° C. for 10 hours.

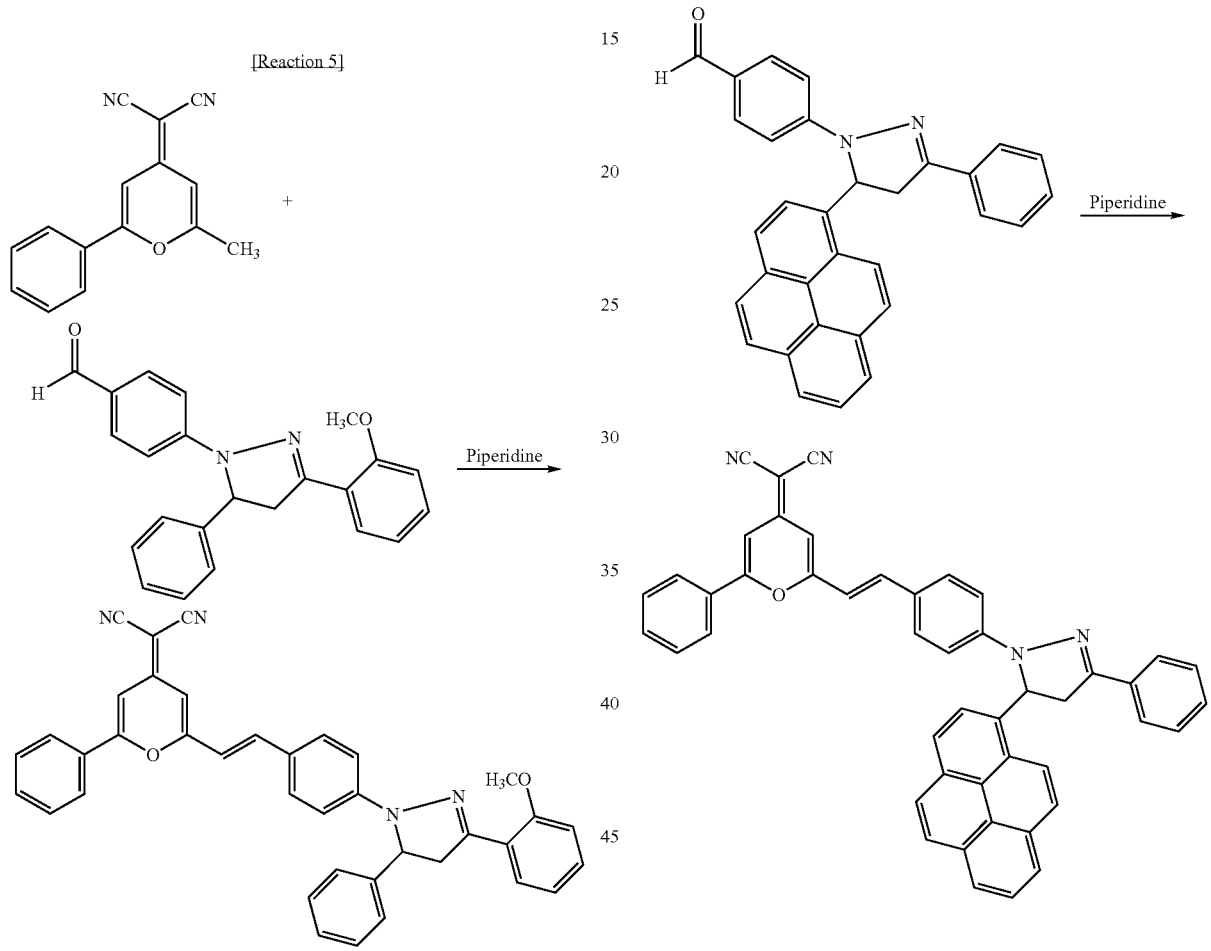

After cooling the reaction solution, the precipitated red solid was filtered, and recrystallized with chloroform-methanol to obtain 0.4 g of the target compound (Yield 83%).

EXAMPLE 6

Synthesis of 2-(2-phenyl-6-{2-[4-(3-phenyl-5-pyren-1-yl-4,5-dihydro-pyrazol-1-yl)-phenyl]-vinyl}-pyran-4-ylidene)-malononitrile As shown in the following reaction 6, 0.5 g (2.13 mmol) of 2-(2-methyl-6-phenyl-pyran-4-ylidene)-malononitrile and 0.961 g (2.13 mmol) of 4-(3-phenyl-5-pyren-1-yl-4,5-dihydro-pyrazol-1-yl)-benzaldehyde were added into 50 ml of ethanol, and 0.27 g (3.2 mmol) of piperidine was added thereto. The reaction solution was heated at 75° C. for 10 hours.

After cooling the reaction solution, the precipitated red solid was filtered, and recrystallized with chloroform-methanol to obtain 0.72 g of the target compound (Yield 50%).

EXAMPLE 7

Synthesis of 2-(2-{2-[4-(5-biphenyl-4-yl-3-phenyl-4,5-dihydro-pyrazol-1-yl)]-phenyl}-vinyl)-6-phenyl-pyran-4-ylidene)-malononitrile As shown in the following reaction 7, 0.27 g (1.16 mmol) of 2-(2-methyl-6-phenyl-pyran-4-ylidene)-malononitrile) and 0.47 g (1.16 mmol) of 4-(5-biphenyl-4-yl-3-phenyl-4,5-dihydro-pyrazol-1-yl)-benzaldehyde were added into 20 ml of ethanol, and 0.15 g (1.74 mmol) of piperidine was added thereto. The reaction solution was heated at 75° C. for 10 hours.

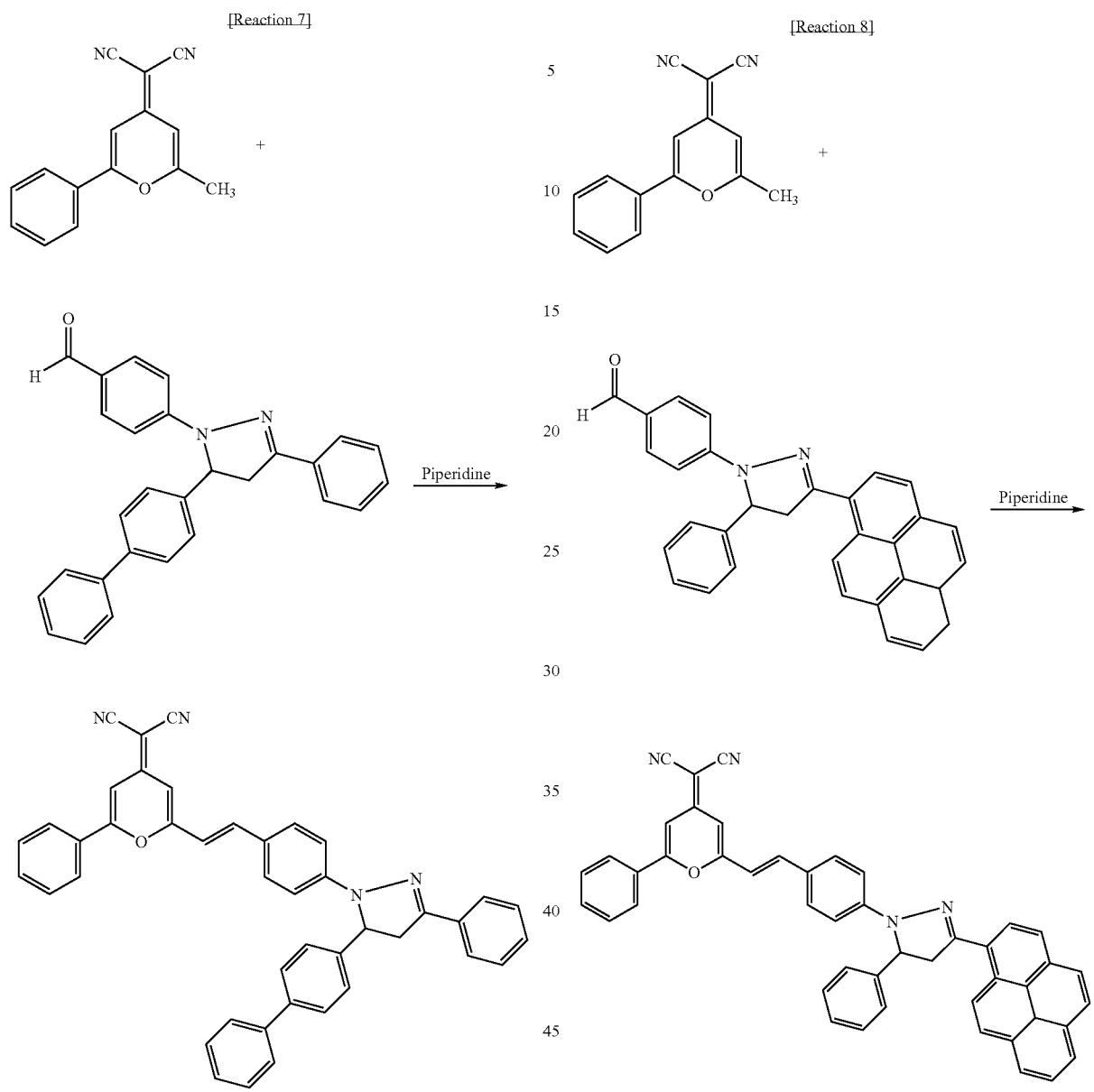

After cooling the reaction solution, the precipitated red solid was filtered, and recrystallized with methanol to obtain 0.65 g of the target compound (Yield 90%).

EXAMPLE 8

Synthesis of 2-(2-phenyl-6-{2-[4-(5-phenyl-3-pyren-1-yl-4,5-dihydro-pyrazol-1-yl)-phenyl]-vinyl}-pyran-4-ylidene)-malononitrile As shown in the following reaction 8, 0.24 g (1.0 mmol) of 2-(2-methyl-6-phenyl-pyran-4-ylidene)-malononitrile and 0.46 g (1.0 mmol) of 4-(5-phenyl-3-pyren-1-yl-4,5-dihydro-pyrazol-1-yl)benzaldehyde were added into 20 ml of ethanol, and 0.13 g (1.53 mmol) of piperidine was added thereto. The reaction solution was heated at 75° C. for 10 hours.

After cooling the reaction solution, the precipitated red solid was filtered, and recrystallized with chloroform to obtain 0.52 g of the target compound (Yield 75%).

EXAMPLE 9

Synthesis of 2-(2-{2-[4-(3,5-diphenyl-4,5-dihydro-pyrazol-1-yl)-phenyl]-vinyl}-6-isopropyl-pyran-4-ylidene)-malononitrile As shown in the following reaction 9, 0.5 g (2.5 mmol) of 2-(2-isopropyl-6-methyl-pyran-4-ylidene)-malononitrile and 0.815 g (2.5 mmol) of 4-(3,5-diphenyl-4,5-dihydro-pyrazol-1-yl)-benzaldehyde were added into 20 ml of ethanol, and 0.32 g (3.75 mmol) of piperidine was added thereto. The reaction solution was heated at 75° C. for 10 hours.

[Reaction 9]

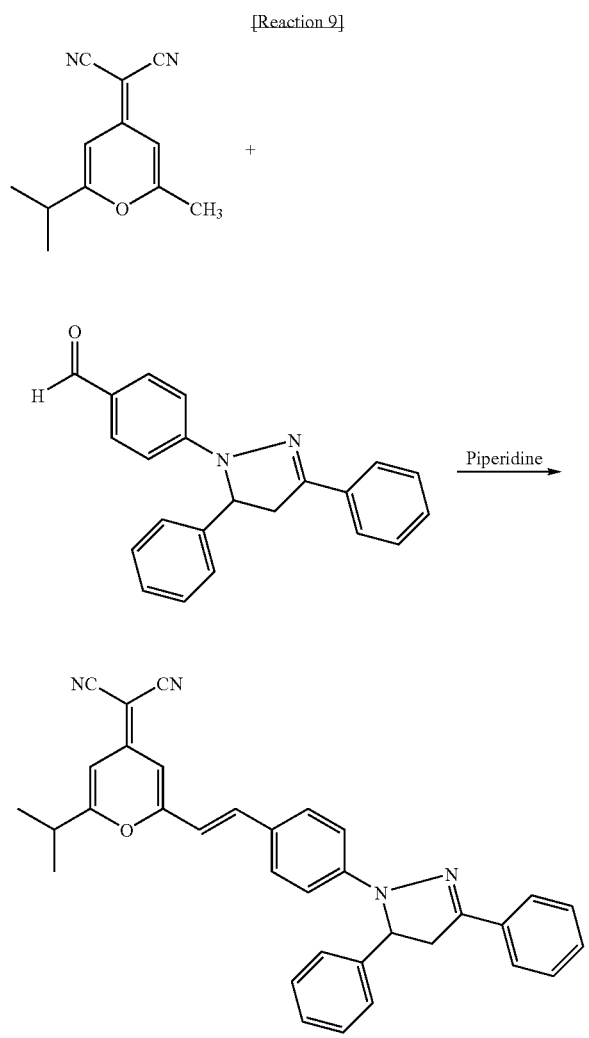

After cooling the reaction solution, the precipitated red solid was filtered, and purified with a column chromatography to obtain 0.6 g of the target compound (Yield 50%).

EXAMPLE 10

An Indium Tin oxide (ITO) coated glass substrate was ultrasonically washed, and then washed with deionized water. The grease on the washed substrate was removed with gas phase toluene. The hole injecting layer of thickness of 300 Å was formed by vacuum depositing m-MTDATA on the ITO electrode layer, and a hole transporting layer of thickness of 200 Å was formed by vacuum depositing α-NPD on the hole injecting layer.

The red organic light-emitting compounds of examples 1–9 were deposited to a thickness of 650 Å as the host material on the hole transporting layer, or the mixtures of Alq3 (host material) and one of the red organic light-emitting compounds of examples 1–9 (dopant, mixing amount: 2 to 50% by weight) were co-deposited to a thickness of 650 Å on the hole transporting layer to form the organic light-emitting layers. Then, TAZ was vacuum deposited to a thickness of 50 Å to form an electron transporting layer on the organic light-emitting layer, and LiF of thickness of 5 Å was deposited on the electron transporting layer to form the electron injecting layer. Finally, Al of thickness of 2000 Å were deposited on the electron injecting layer to form the cathode of an organic electroluminescence device.

The melting temperatures [Tm] of the organic light-emitting compounds of Examples 1 to 3 were measured, and the photoluminescences (PL) thereof were measured with using dichloroethane solvent. The results are shown in Table 1. In addition, the organic electroluminescence devices were prepared with the compounds according to the method described in Example 10, and the maximum brightness of the devices were also measured. The results are also shown in Table 1.

TABLE 1

|  | PL(nm) | Tm(° C.) | Maximum brightness (cd/m$^2$) | Doping amount |
|---|---|---|---|---|
| Example 1 | 625 | 280 | 4952/14 V | 2 wt % |
| Example 2 | 680 | 312 | 1873/19.4 V | 2 wt % |
| Example 3 | 660 | 257 | 2650/16.5 V | 2 wt % |

The melting temperatures [Tm], the glass transition temperatures [Tg] and the photoluminescences (PL, solvent: dichloroethane) of the organic light-emitting compounds of Examples 4 to 9 were measured. The results are shown in Table 2. In addition, the organic electroluminescence devices were prepared with the compounds according to the method described in Example 10, and the maximum brightness and the color coordinates of the devices were measured. The results are also shown in Table 2.

TABLE 2

|  | solution PL(nm) (Dichloroethane) | Tm(° C.)/ Tg(° C.) | Maximum brightness (cd/m$^2$) | Color coordinate (x/y) | Doping amount |
|---|---|---|---|---|---|
| Example 4 | 640 | 312/— | 873/14 V | 0.69/0.32 | Host |
| Example 5 | 655 | 289/124 | 1952/19.4 V | 0.62/0.40 | 50 wt % |
| Example 6 | 640 | 310/— | 2450/19.8 V | 0.62/0.38 | 10 wt % |
| Example 7 | 645 | 300/— | 2450/19.8 V | 0.62/0.38 | 10 wt % |
| Example 8 | 670 | 326/152 | 735/15.6 V | 0.67/0.33 | Host |
| Example 9 | 610 | 225/— | 2223/18.4 V | 0.51/0.49 | 10 wt % |

As shown in tables 1 and 2, the red organic light-emitting compound of the present invention has a high melting temperature (Tm) and a high glass transition temperature (Tg), and thus the stability and the life-span of the organic electroluminescence device including the compound can be improved. In addition, the organic light-emitting compound of the present invention has a superior brightness and emits various red lights having the high quality. Therefore, the organic light-emitting compound of the present invention is useful as the host material or the red dopant of an organic light-emitting layer.

As described above, the red organic light-emitting compound of the present invention has a superior heat-resistance and stability, is capable of emitting red lights of various wavelength according to the substituent, and produces high quality display image. Thus the red organic light-emitting compound is particularly useful for producing a full color organic light-emitting device having a long life-span. In addition, the red organic light-emitting compound of the present invention can be applied for various devices, such as a field effect transistor, a photodiode, a photovoltaic cell, a solar cell, an organic laser, a laser diode, and so on.

What is claimed is:

1. A red organic light-emitting compound represented by the following chemical formula 2,

[Chemical formula 2]

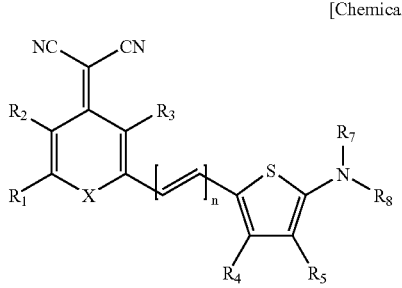

wherein X is C, O, S, SO$_2$ or N; R$_1$, R$_2$, and R$_3$ can be the same or different, and are hydrogen, substituted or non-substituted alkyl group containing from 1 to 20 carbon atoms, substituted or non-substituted alkoxy group containing from 1 to 5 carbon atoms, substituted or non-substituted aryl or heteroaryl group containing from 4 to 24 carbon atoms, substituted or non-substituted heterocyclic group containing from 4 to 6 carbon atoms, or fused ring group containing from 4 to 24 carbon atoms; R$_4$ and R$_5$ can be the same or different and contain O, and R$_4$ and R$_5$ are connected to form a heterocyclic ring; R$_7$ and R$_8$ can be the same or different, and are the functional group defined for R1; and n is 1, 2 or 3.

2. The A red organic light-emitting compound according to claim 1, wherein the red organic light-emitting compound is a compound represented by the following chemical formula 3, (Chemical formula 3)

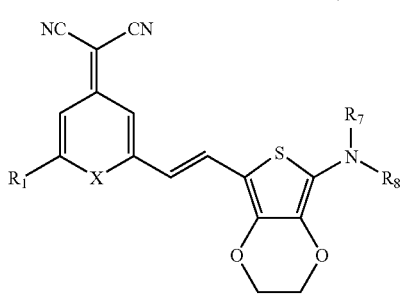

wherein, X, R$_1$, R$_7$ and R$_8$ are as defined in the chemical formula 2.

3. The red organic light-emitting compound according to claim 2, wherein X is O; R$_1$ is tert-butyl group; and R$_7$ and R$_8$ are methyl group.

4. An organic light-emitting device comprising:
a first electrode having a high work function;
a second electrode having a low work function; and
at least one organic layer formed between the first electrode and the second electrode, which includes the red organic light-emitting compound of the chemical formula 2 of claim 1.

5. The organic light-emitting device according to claim 4, wherein the red organic light-emitting compound of the chemical formula 2 is used as a host material or a dopant of an organic light-emitting layer.

6. A red organic light-emitting compound represented by the following chemical formula 4,

[Chemical formula 4]

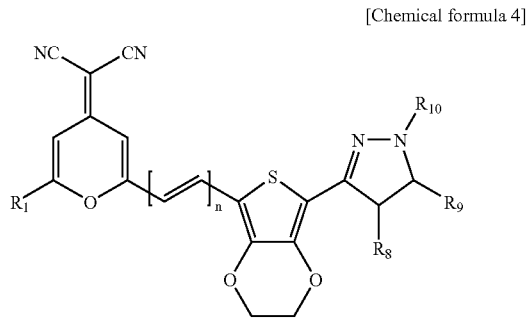

wherein R$_1$, and R$_8$ to R$_{10}$ can be the same or different, and are hydrogen, substituted or non-substituted alkyl group containing from 1 to 20 carbon atoms, substituted or non-substituted alkoxy group containing from 1 to 5 carbon atoms, substituted or non-substituted aryl or heteroaryl group containing from 4 to 24 carbon atoms, substituted or non-substituted heterocyclic group containing from 4 to 6 carbon atoms, or fused ring group containing from 4 to 24 carbon atoms; and n is 1, 2 or 3.

7. The red organic light-emitting compound according to claim 6, wherein R$_1$ is tert-butyl group; R$_8$ is hydrogen; R$_9$ is phenyl group; and R$_{10}$ is 3-methylphenyl group.

8. An organic light-emitting device comprising:
a first electrode having a high work function;
a second electrode having a low work function; and
at least one organic layer formed between the first electrode and the second electrode, which includes the red organic light-emitting compound of the chemical formula 4 of claim 6.

9. The organic light-emitting device according to claim 8, wherein the red organic light-emitting compound of the chemical formula 4 is used as a host material or a dopant of an organic light-emitting layer.

10. A red organic light-emitting compound represented by the following chemical formula 5,

[Chemical formula 5]

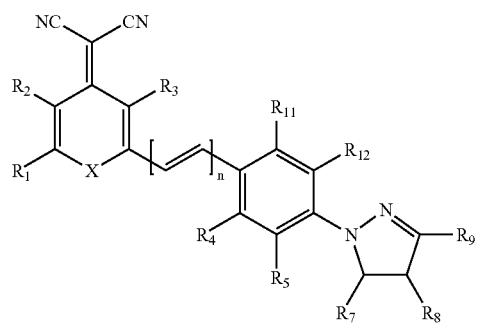

wherein X is C, O, S, $SO_2$ or N; $R_1$ to $R_3$, $R_7$ to $R_9$, $R_{11}$ and $R_{12}$ can be the same or different, and are hydrogen, substituted or non-substituted alkyl group containing from 1 to 20 carbon atoms, substituted or non-substituted alkoxy group containing from 1 to 5 carbon atoms, substituted or non-substituted aryl or heteroaryl group containing from 4 to 24 carbon atoms, substituted or non-substituted heterocyclic group containing from 4 to 6 carbon atoms, or fused ring group containing from 4 to 24 carbon atoms; $R_4$ and $R_5$ can be the same or different, and are the functional group defined for $R_1$ or O; when $R_4$ and $R_5$ contain O, $R_4$ and $R_5$ can be connected to form heterocyclic ring; and n is 1, 2 or 3.

11. The red organic light-emitting compound according to claim 10, wherein the red organic light-emitting compound is a compound represented by the following chemical formula 6,

[Chemical formula 6]

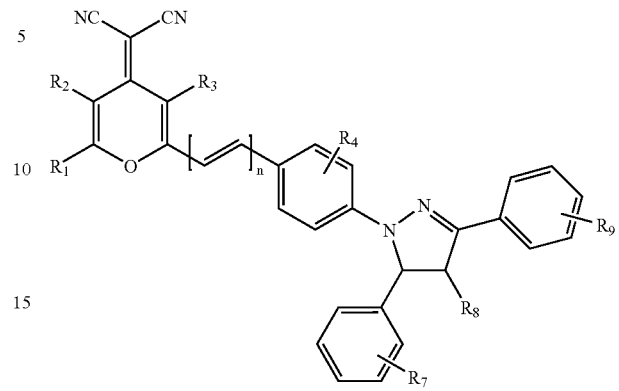

wherein, $R_1$ to $R_4$ are as defined in chemical formula 5; $R_7$ to $R_9$ can be the same or different, and are the functional group defined for $R_1$ in chemical formula 5; and n is 1, 2 or 3.

12. An organic light-emitting device comprising:
a first electrode having a high work function;
a second electrode having a low work function; and
at least one organic layer formed between the first electrode and the second electrode, which includes the red organic light-emitting compound of the chemical formula 5 of claim 10.

13. The organic light-emitting device according to claim 12, wherein the red organic light-emitting compound of the chemical formula 5 is used as a host material or a dopant of an organic light-emitting layer.

* * * * *